(12) United States Patent
Chun

(10) Patent No.: US 6,486,035 B1
(45) Date of Patent: Nov. 26, 2002

(54) SEMICONDUCTOR DEVICE AND METHOD FOR FABRICATING THE SAME

(75) Inventor: Sug Bo Chun, Chungcheongbuk-do (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 41 days.

(21) Appl. No.: 09/708,441

(22) Filed: Nov. 9, 2000

(30) Foreign Application Priority Data

Dec. 30, 1999 (KR) .............................. 99-65533

(51) Int. Cl.⁷ .................... H01L 21/336; H01L 21/3705
(52) U.S. Cl. ................. 438/296; 438/291; 438/303; 438/586; 438/595
(58) Field of Search ................. 438/291, 302, 438/305, 373, 595, 586, 598, 296, 229, 639, 702

(56) References Cited

U.S. PATENT DOCUMENTS

| | | | | |
|---|---|---|---|---|
| 6,235,593 B1 | * | 5/2001 | Huang | 438/279 |
| 6,337,262 B1 | * | 1/2002 | Pradeep et al. | 438/182 |
| 6,391,731 B1 | * | 5/2002 | Chong et al. | 438/303 |
| 6,403,432 B1 | * | 6/2002 | Yu et al. | 438/296 |
| 6,406,987 B1 | * | 6/2002 | Huang | 438/303 |
| 2001/0046748 A1 | * | 11/2001 | Rodder | 438/373 |
| 2001/0053580 A1 | * | 12/2001 | Wasshuber | 438/291 |

OTHER PUBLICATIONS

Techniques for Reducing Hot–Carrier Degradation, Silicon Processing for the VLSI ERA –vol. II, pp. 354 & 355.

* cited by examiner

*Primary Examiner*—Michael S. Lebentritt
(74) *Attorney, Agent, or Firm*—Morgan, Lewis & Bockius LLP

(57) ABSTRACT

Semiconductor device and method for fabricating the same, the device including a semiconductor substrate, a recessed channel region recessed below a surface of the semiconductor substrate, and a gate oxide film formed on the recessed channel region, a first and a second lightly doped impurity regions in surfaces of the substrate adjacent to, and on both sides of the recessed channel region respectively, and a first and a second highly doped impurity regions adjacent to the first and second lightly doped impurity regions, respectively, inverted sidewalls on the first and second lightly doped impurity regions each having a round in a side of the recessed channel region, and a gate electrode both on the inverted sidewalls and the recessed channel region, whereby securing a fabrication allowance and improving a device packing density.

6 Claims, 8 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly to a semiconductor device, in which an inverted sidewall spacer LDD(Lightly Doped Drain) structure is employed for securing a fabrication allowance and improving a device packing density; and a method for fabricating the same.

2. Background of the Related Art

A related art semiconductor device and method for fabricating the same will be explained with reference to the attached drawings. The related art semiconductor device is provided with a device isolating layer 2 of STI structure stuffed in a trench of a depth in a device isolation region, a gate electrode 5 of a planar structure on an active region defined by the device isolating layer 2, gate sidewalls 7a at sides of the gate electrode 5, source/drain regions having LDD regions 6a and 6b in surfaces of the semiconductor substrate under the gate sidewalls 7a and highly doped impurity regions 8a and 8b in surfaces of the semiconductor substrate 1 on both sides of the gate sidewalls 7a and the gate electrode 5, an interlayer insulating layer 9 having contact holes to the source/drain regions selectively, and metal electrode layers 10a and 10b in contact with the source/drain regions through the contact holes in the interlayer insulating layer 9, respectively. The LDD regions 6a and 6b is formed between a channel region under the gate electrode 5 and the highly doped impurity regions 8a and 8b.

A related art method for fabricating a semiconductor device will be explained. FIGS. 1A~1H illustrate sections showing the steps of a related art method for fabricating a semiconductor device.

Referring to FIG. 1A, the related art method for fabricating a semiconductor device starts with forming an oxide film 2 and a nitride layer 3 on a semiconductor substrate 1 in succession. Then, as shown in FIG. 1B, the nitride layer 3 and the oxide film 2 are removed selectively by photolithography, and exposed portions of the semiconductor substrate 1 are etched to a depth, to form trenches. The trenches are stuffed with an insulating material, and planarized, to form a device isolating layer 4 of an STI (Shallow Trench Isolation) structure. As shown in FIG. 1C, the nitride layer 3 is removed. And, as shown in FIG. 1D, a gate electrode 5 is formed on an active region defined by the device isolation layer 4. As shown in FIG. 1E, the gate electrode 5 is used as a mask in implanting impurities in the surfaces of the semiconductor substrate 1 lightly, to form LDD regions 6a and 6b. As shown in FIG. 1F, a gate sidewall forming material layer, such as an HLD(High Temperature Low Pressure Deposition) layer 7, is formed on an entire surface inclusive of the gate electrode 5. Then, as shown in FIG. 1G, the HLD layer 7 is etched back, leaving the HLD layer 7 on side surfaces of the gate electrode 5, to form gate sidewalls 7a. The gate electrode 5 inclusive of the gate sidewalls 7a is used as a mask in implanting impurities highly, to form source/drain regions having LDD regions 6a and 6b and impurity regions 8a and 8b. As shown in FIG. 1H, an interlayer insulating layer 9 is formed on an entire surface, and etched selectively, to expose the source/drain regions, to form metal electrode layers 10a and 10b. The related art method for fabricating a semiconductor device has a minimum line width in the gate electrode patterning fixed from a limitation of resolution of photolithography.

However, the related art semiconductor device and method for fabricating the same have the following problems.

The patterning of the gate electrode by photolithography and the planar gate electrode are difficult to apply to a method for fabricating a submicron device with a line width of the circuit in a range of 0.1 $\mu$m. The limitation in reduction of line width of the circuit causes difficulty in securing a fabrication allowance in fabrication of devices of high device packing density. The wide variation of CD(Critical Dimension) in the gate electrode patterning causes difficulty in obtaining products with stable characteristics.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which permits to secure a fabrication allowance and to improve a device packing density.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a semiconductor substrate, a recessed channel region recessed below a surface of the semiconductor substrate, and a gate oxide film formed on the recessed channel region, a first and a second lightly doped impurity regions in surfaces of the substrate adjacent to, and on both sides of the recessed channel region respectively, and a first and a second highly doped impurity regions adjacent to the first and second lightly doped impurity regions, respectively, inverted sidewalls on the first and second lightly doped impurity regions each having a round in a side of the recessed channel region, and a gate electrode both on the inverted sidewalls and the recessed channel region.

In another aspect of the present invention, there is provided a method for fabricating a semiconductor device, including the steps of (1) forming an oxide film and a nitride film on a semiconductor substrate in succession and patterning selectively, and forming trenches using the patterned oxide film and the nitride film, (2) stuffing an insulating material in the trenches, to form device isolating layers, (3) removing a width of the nitride film on an active region defined by the device isolating layers, to form a channel defining trench, (4) using the patterned nitride film as a mask in implanting impurities lightly, to form lightly doped impurity regions for forming LDDs, (5) forming inverted sidewalls at sides of the channel defining trench, and oxidizing a bottom portion, to form the LDD regions, (6) removing the oxide film on a bottom surface of the channel defining trench, to form a channel of semispherical recess with a depth, (7) removing the nitride layer, forming a gate oxide film on a surface of a recessed channel region, and forming a gate electrode both on the inverted sidewalls and the gate oxide film, and (8) using the gate electrode inclusive of the inverted sidewalls as a mask in implanting impurities, heavily.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
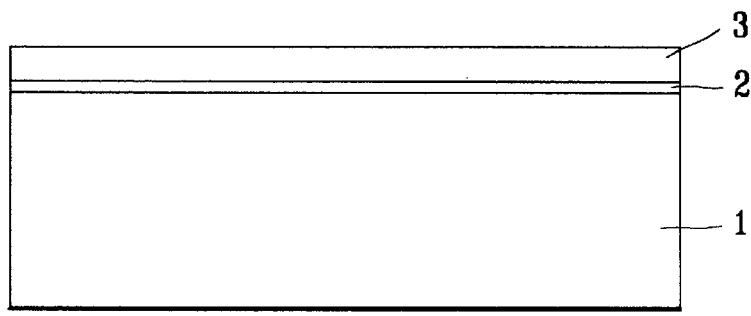
FIGS. 1A~1H illustrate sections showing the steps of a related art method for fabricating a semiconductor device.
Figure 1B:
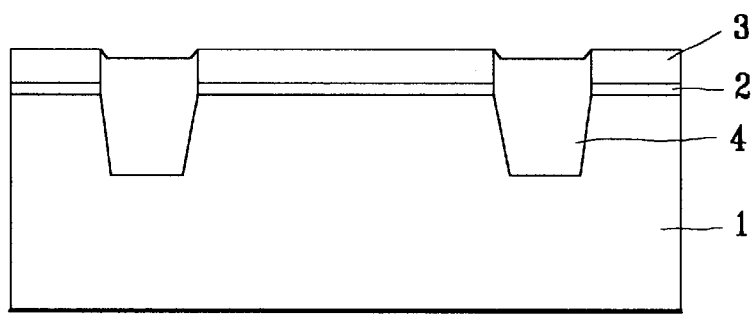
Figure 1C:
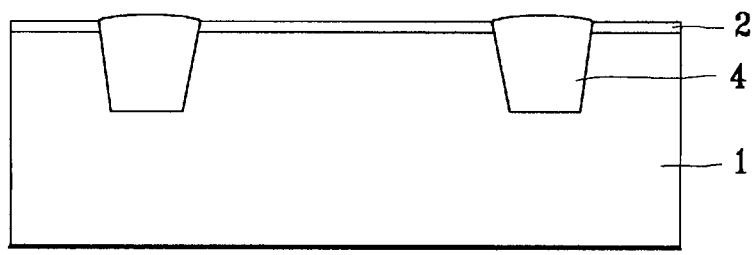
Figure 1D:
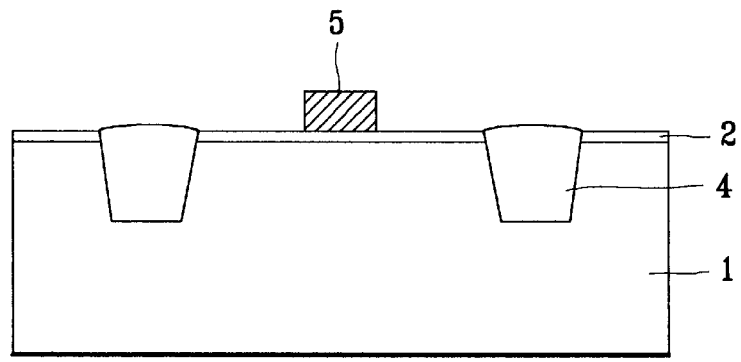
Figure 1E:
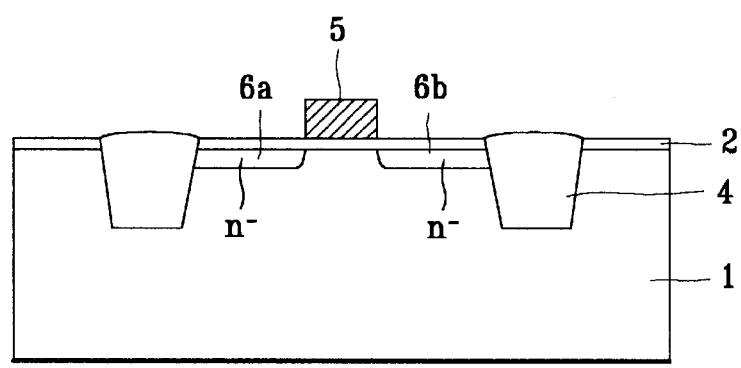
Figure 1F:
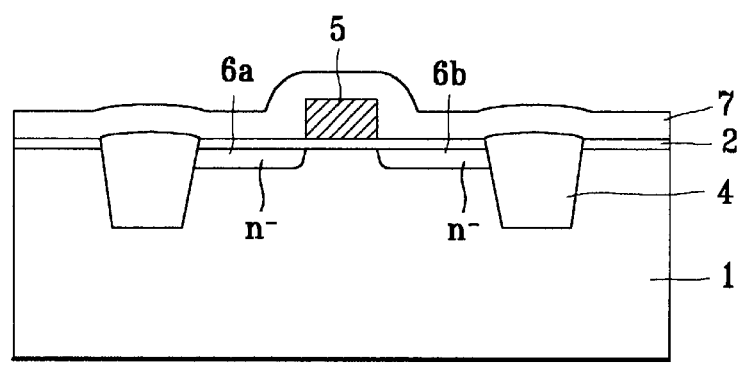
Figure 1G:
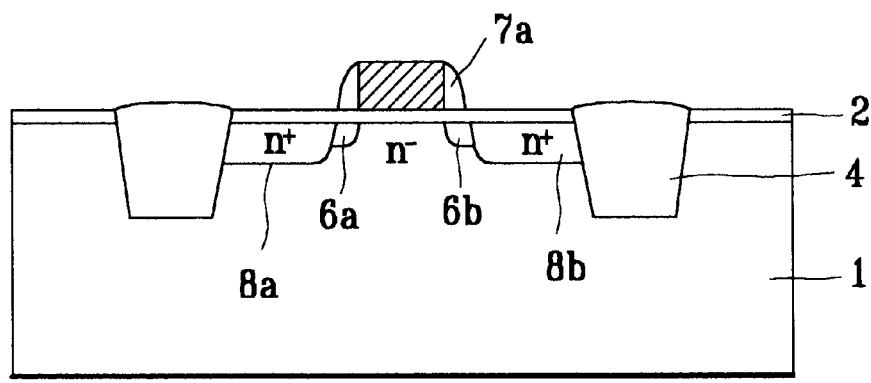
Figure 1H:
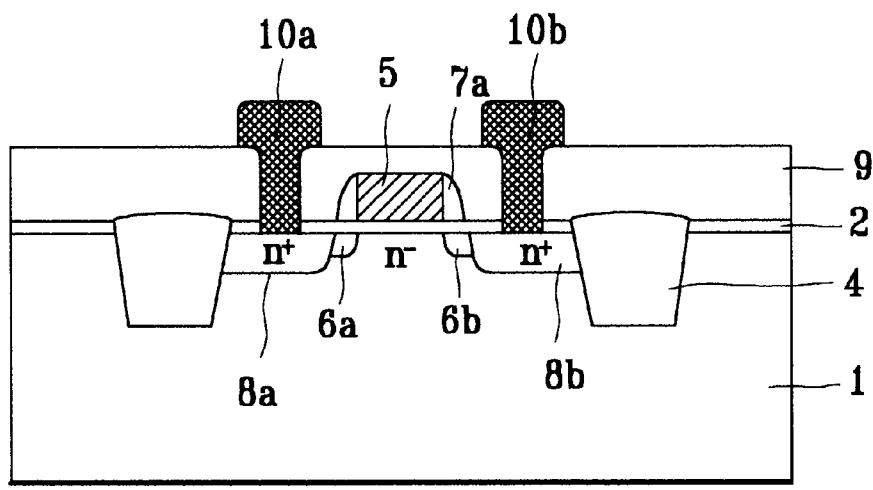
Figure 2:
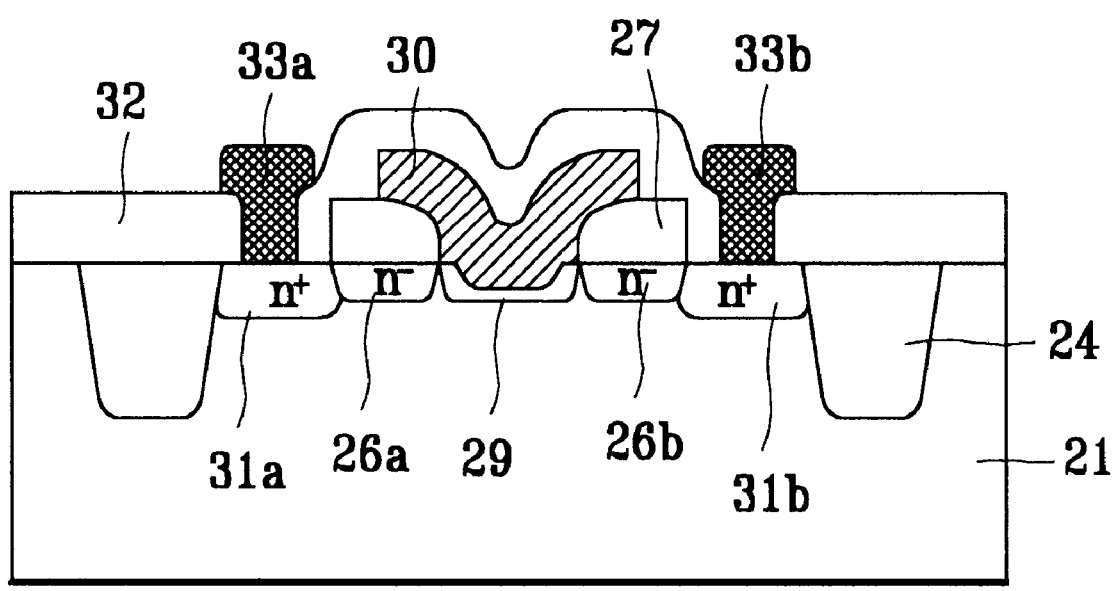
FIG. 2 illustrates a section of a semiconductor device in accordance with a preferred embodiment of the present invention; and, FIGS. 3A~3K illustrate sections showing the steps of a method for fabricating a semiconductor device in accordance with a preferred embodiment of the present invention.

Reference will now be made in detail to the preferred embodiments of the present invention, examples of which are illustrated in the accompanying drawings. FIG. 2 illustrates a section of a semiconductor device in accordance with a preferred embodiment of the present invention, and FIGS. 3A~3K illustrate sections showing the steps of a method for fabricating a semiconductor device in accordance with a preferred embodiment of the present invention. The semiconductor device of inverted sidewall LDD structure of the present invention has the following structure.

Referring to FIG. 2, the semiconductor device of inverted sidewall LDD structure of the present invention includes device isolation layers 24 of STI structure stuffed in trenches each with a depth in device isolating regions of a semiconductor substrate 21, a recessed channel region 28 of semispherical form with a depth in an active region defined by the device isolation layers 24, a gate oxide film 29 formed on a surface of the recessed channel region 28, a first and a second lightly doped impurity regions, i.e., LDD regions 26a and 26b adjacent to, and on both sides of the recessed channel region 28, inverted sidewalls 27 on the LDD regions 26a and 26b each having a round form in a side of the recessed channel region 28 and a vertical form to the substrate in an outer side of the recessed channel region 28, a recessed gate electrode 30 on the gate oxide film 29 and the inverted sidewalls 27 having a bottom portion positioned below a surface of the substrate and a top portion recessed identical to, and as much as a recessed depth of the recessed channel region 28 according to a form of the recessed channel region 28, a first and a second highly doped impurity regions 31a and 31b on both sides of the gate electrode 30 adjacent to the LDD regions 26a and 26b and aligned to the inverted sidewalls 27, an interlayer insulating layer 32 on an entire surface inclusive of the gate electrode 30 having contact holes to the first and second highly doped impurity regions 31a and 31b, and metal electrode layers 33a and 33b in contact with the highly doped impurity regions 31a and 31b through the contact holes in the interlayer insulating layer 32. In this instance, it is apparent that a distance along a surface of the channel region is greater than a horizontal distance between the LDD regions 26a and 26b as the channel region is recessed in a semispherical form. And, a line width is reduced by a size of a portion at which the gate electrode 30 and the inverted sidewalls 27 are overlapped. And, the gate electrode 30 has a uniform thickness.

A method for fabricating the semiconductor device in accordance with a preferred embodiment of the present invention will be described.

Figure 3A:
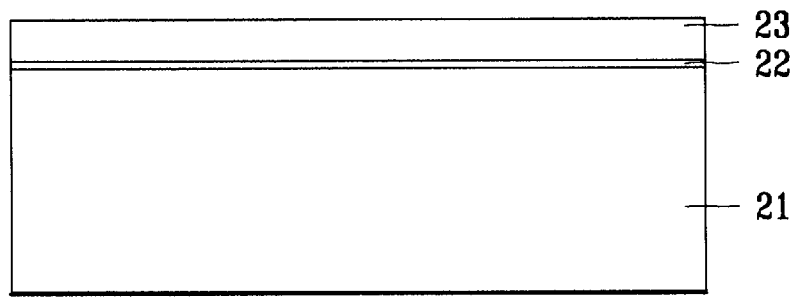
Figure 3B:
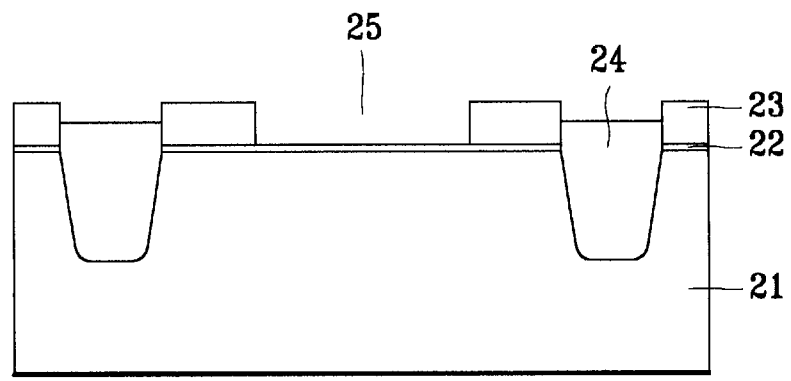
Figure 3C:
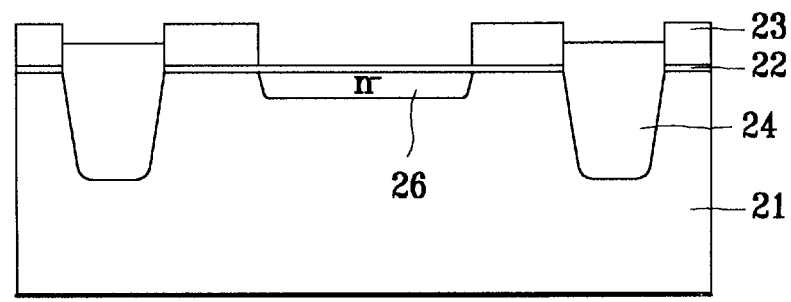
Figure 3D:
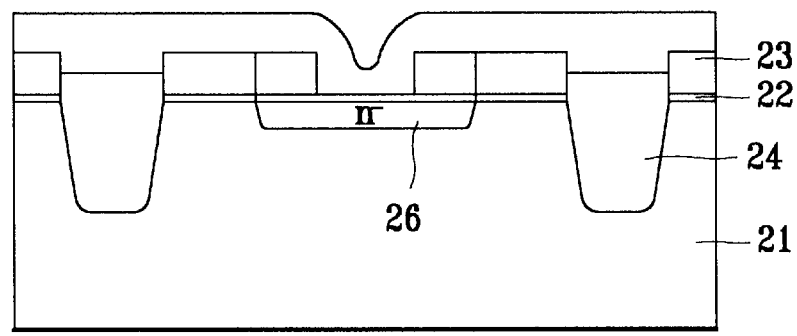
Figure 3E:
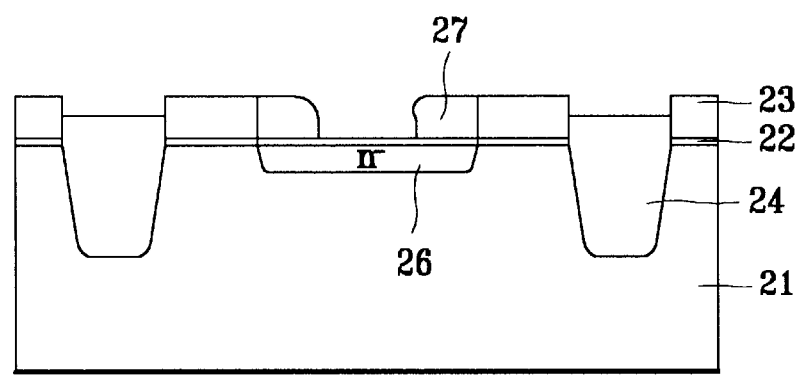
Figure 3F:
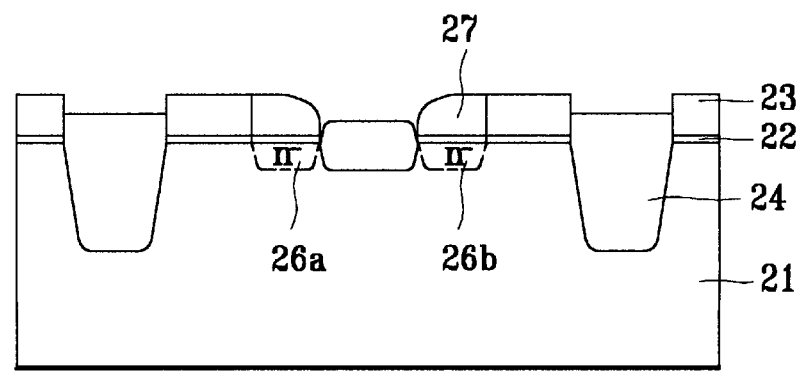
Figure 3G:
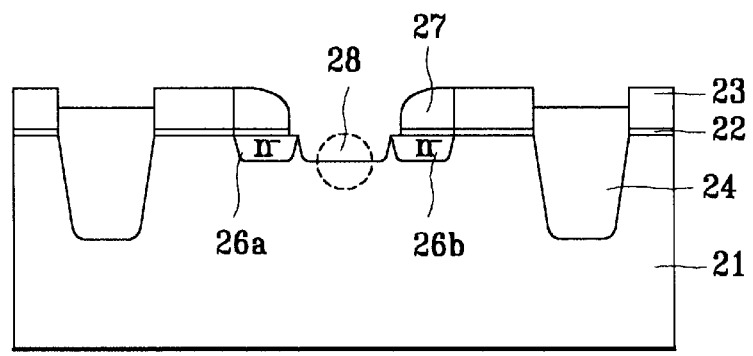
Figure 3H:
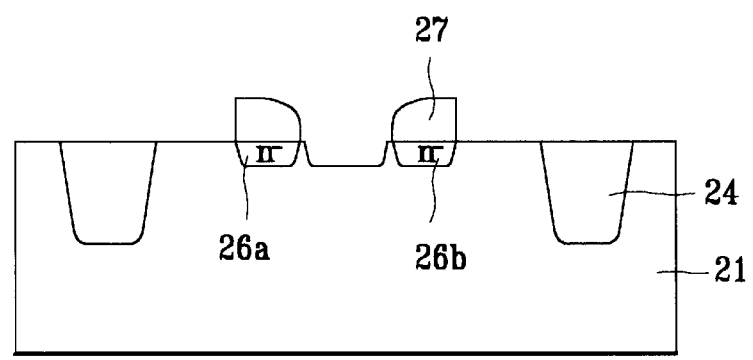
Figure 3I:
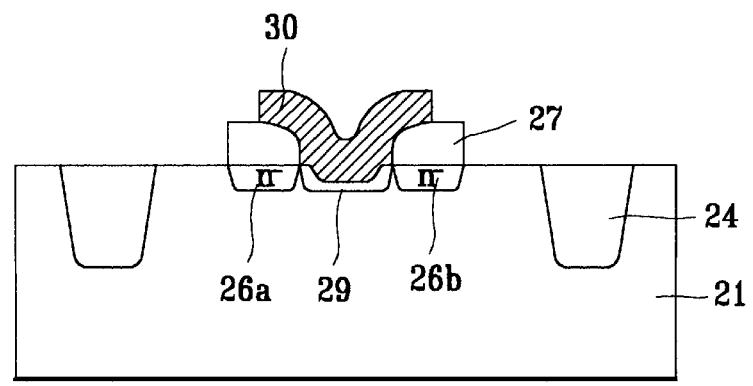
Figure 3J:
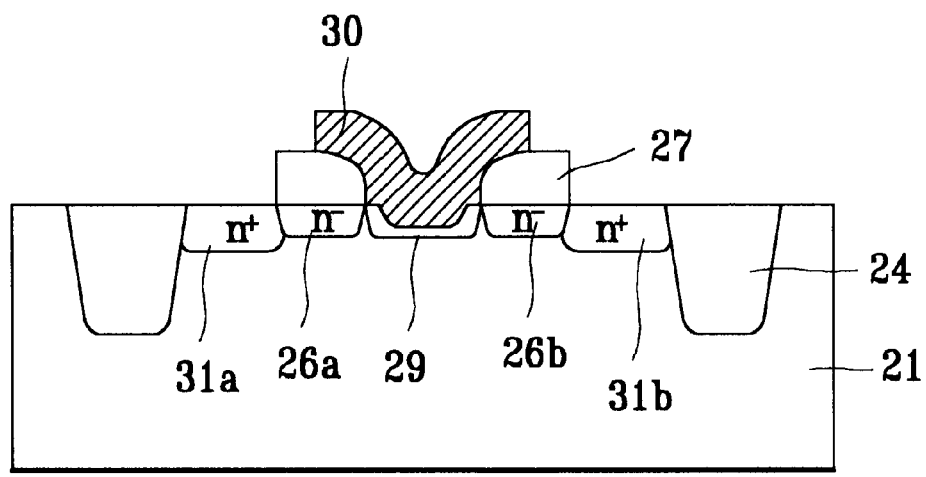
Figure 3K:
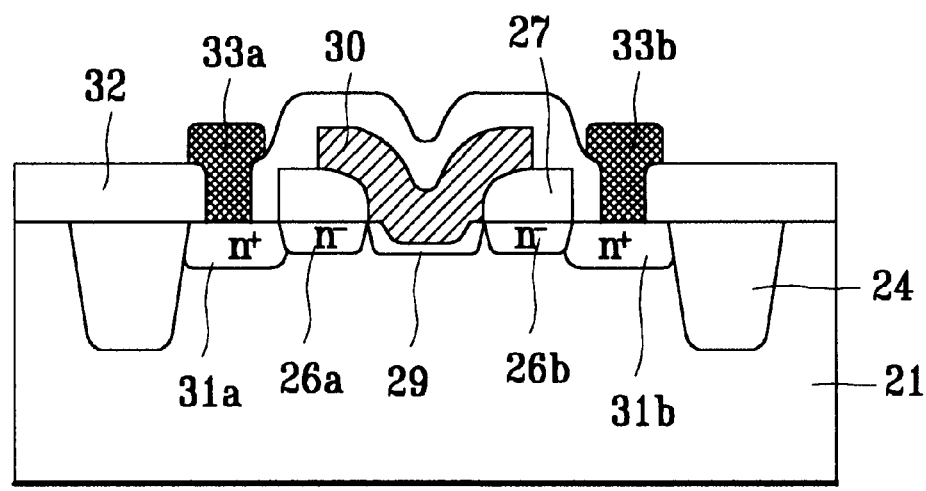

Referring to FIG. 3A, an oxide film 22 having a thickness of 90~110 Å and a nitride layer 23 having a thickness of 1400~1600 Å are formed on a semiconductor substrate 21 in succession. As shown in FIG. 3B, the nitride layer 23 and the oxide film 22 are selectively removed by photolithography, and exposed portions of the semiconductor substrate 21 are etched, to form trenches. The trenches are stuffed with an insulating material, and planarized by CMP(Chemical Mechanical Polishing), to form device isolating layers 24 of STI structure. A width of the nitride layer 23 on the active region defined by the device isolating layer 24 is removed, to form a channel defining trench 25. As shown in FIG. 3C, impurities are implanted in the channel defining trench 25 lightly, to form a lightly doped impurity region 26 for forming LDDs. Then, as shown in FIG. 3D, a material layer for forming gate sidewalls, such as an HLD layer is formed on an entire surface having the lightly doped impurity region 26 for forming LDDs is formed thereon. As shown in FIG. 3E, the material layer for forming gate sidewalls is etched back, to form inverted sidewalls 27 at sides of the channel defining trench 25. As shown in FIG. 3F, a bottom portion of the channel defining trench 25 having the inverted sidewalls 27 formed thereon is oxidized, to divide the lightly doped impurity regions 26 in two portions, to form LDD regions 26a and 26b. And, as shown in FIG. 3G, an oxide film on a bottom surface of the channel defining trench 25 is removed by wet etching, to form a channel region of semispherical recess. Then, as shown in FIG. 3H, the nitride layer 23 is removed. And, as shown in FIG. 3I, an oxidation process is conducted, to form a gate oxide film 29 on a surface of the channel region 28. Then, a material layer for forming a gate electrode, such as polysilicon, is formed, and selectively patterned by photolithography to form a gate electrode 30. As shown in FIG. 3J, the gate electrode 30 inclusive of the inverted sidewalls 27 is used as a mask in implanting impurities highly, to form source/drain regions having LDD regions 26a and 26b and highly doped impurity regions 31a and 31b. Then, as shown in FIG. 3K, an interlayer insulating layer 32 is formed on an entire surface, and etched selectively, until the source/drain regions are exposed. And, metal electrode layers 33a and 33b in contact with the exposed source/drain regions are formed. Thus, the method for fabricating a semiconductor device permits to form a circuit line width to be beyond a limitation of resolution of photolithography by employing inverted sidewall structure and forming the channel region of semispherical recess.

The semiconductor device and method for fabricating the same of the present invention have the following advantages.

First, the utilization of the nitride layer for forming device isolating layer in the formation of the LDD structure can simplify a fabrication process.

Second, the utilization of the inverted sidewalls in formation of the channel region and the gate electrode permits application of the present invention to a device fabrication process of submicron structure.

Third, the lessened variation of critical dimension of the gate electrode caused by to patterning the gate electrode after formation of the gate sidewalls and the LDD regions permits the devices to have a stable characteristics.

Fourth, the adequate fabrication allowance secured by patterning the gate electrode after formation of the gate sidewalls and the LDD regions is favorable in view of improvement of a device reliability and yield.

Fifth, the adequately secured channel region length within a limited area by forming the channel region of semispherical recess is favorable in fabrication of devices with high device packing densities.

It will be apparent to those skilled in the art that various modifications and variations can be made in the semiconductor device and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:
    (1) forming an oxide film and a nitride film on a semiconductor substrate in succession and patterning selectively, and forming trenches using the patterned oxide film and the nitride film;
    (2) stuffing an insulating material in the trenches, to form device isolating layers;
    (3) removing a width of the nitride film on an active region defined by the device isolating layers, to form a channel defining trench;
    (4) using the patterned nitride film as a mask in implanting impurities lightly, to form lightly doped impurity regions for forming LDDs;
    (5) forming inverted sidewalls at sides of the channel defining trench, and oxidizing a bottom portion, to form the LDD regions;
    (6) removing the oxide film on a bottom surface of the channel defining trench, to form a channel of semispherical recess with a depth;
    (7) removing the nitride layer, forming a gate oxide film on a surface of a recessed channel region, and forming a gate electrode both on the inverted sidewalls and the gate oxide film; and,
    (8) using the gate electrode inclusive of the inverted sidewalls as a mask in implanting impurities, heavily.

2. A method as claimed in claim 1, wherein the nitride film has a thickness of 1400~1600 Å.

3. method as claimed in claim 1, wherein the formation of the inverted sidewalls in the step (5) includes the steps of;
    forming, and etching back an HLD layer on an entire surface having the lightly doped impurity regions for forming the LDDs formed therein.

4. A method as claimed in claim 3, wherein the inverted sidewalls have a height fixed by a thickness of the nitride film.

5. A method as claimed in claim 1, wherein the step (6) is carried out by wet etching.

6. A method as claimed in claim 1, wherein the formation of a gate electrode in the step (7) includes the steps of;
    forming a polysilicon layer on an entire surface having the inverted sidewalls and the give oxide film formed thereon, and
    selectively patterning the polysilicon layer by photolithography,
    thereby forming the gate electrode having a bottom portion positioned below a surface of the substrate and a top portion recessed identical to, and as much as a recessed depth of the recessed channel region according to a form of the recessed channel region.

* * * * *